United States Patent [19]

Sano

[11] Patent Number: 5,166,852
[45] Date of Patent: Nov. 24, 1992

[54] ELECTRONIC CIRCUIT DEVICE FOR PROTECTING ELECTRONIC CIRCUITS FROM UNWANTED REMOVAL OF GROUND TERMINAL

[75] Inventor: Yoshiyuki Sano, Yokohama, Japan

[73] Assignee: Kabushiki Kaisha Toshiba, Kawasaki, Japan

[21] Appl. No.: 604,242

[22] Filed: Oct. 29, 1990

[30] Foreign Application Priority Data

Oct. 31, 1989 [JP] Japan ................. 1-281759

[51] Int. Cl.⁵ .................. H02H 3/00; H02H 7/00
[52] U.S. Cl. ...................... 361/42; 361/92; 361/18; 340/649
[58] Field of Search .............. 361/42, 45, 49, 60, 361/92, 18; 340/509, 510, 649, 650, 651

[56] References Cited

U.S. PATENT DOCUMENTS

| | | | |
|---|---|---|---|
| 3,684,924 | 8/1972 | Miller, Jr. | 361/58 |
| 3,754,182 | 8/1973 | Morris et al. | 361/18 |
| 4,439,805 | 3/1984 | Tartelan | 361/92 |
| 4,441,136 | 4/1984 | Hampshire | 361/88 |
| 4,725,912 | 2/1988 | Wrathall | 361/18 |
| 4,931,893 | 6/1990 | Glennon et al. | 340/649 |

FOREIGN PATENT DOCUMENTS

| | | | |
|---|---|---|---|
| 0177305 | 4/1986 | European Pat. Off. | 361/42 |
| 0239862 | 10/1987 | European Pat. Off. | |
| 2204199 | 11/1988 | United Kingdom | 361/45 |

OTHER PUBLICATIONS

European Search Report, mailed Apr. 29, 1992.

Primary Examiner—Steven L. Stephan
Assistant Examiner—Ben Davidson
Attorney, Agent, or Firm—Finnegan, Henderson, Farabow, Garrett and Dunner

[57] ABSTRACT

An electronic circuit device having a protection circuit for protecting a switching system electronic circuit when a ground terminal is removed from the device. The protection circuit includes a detection circuit for detecting the ground terminal has been removed from ground as a change in an electronic potential of the ground terminal, an input cut-off circuit connected between an input terminal and the electronic circuit to control an operation of the electronic circuit, a low voltage protection circuit for controlling an operation of the electronic circuit in response to an output signal from the detection circuit, and a memory circuit for controlling an operation of the input cut-off circuit in response to both output signals from the detection circuit and the low voltage protection circuit.

17 Claims, 4 Drawing Sheets

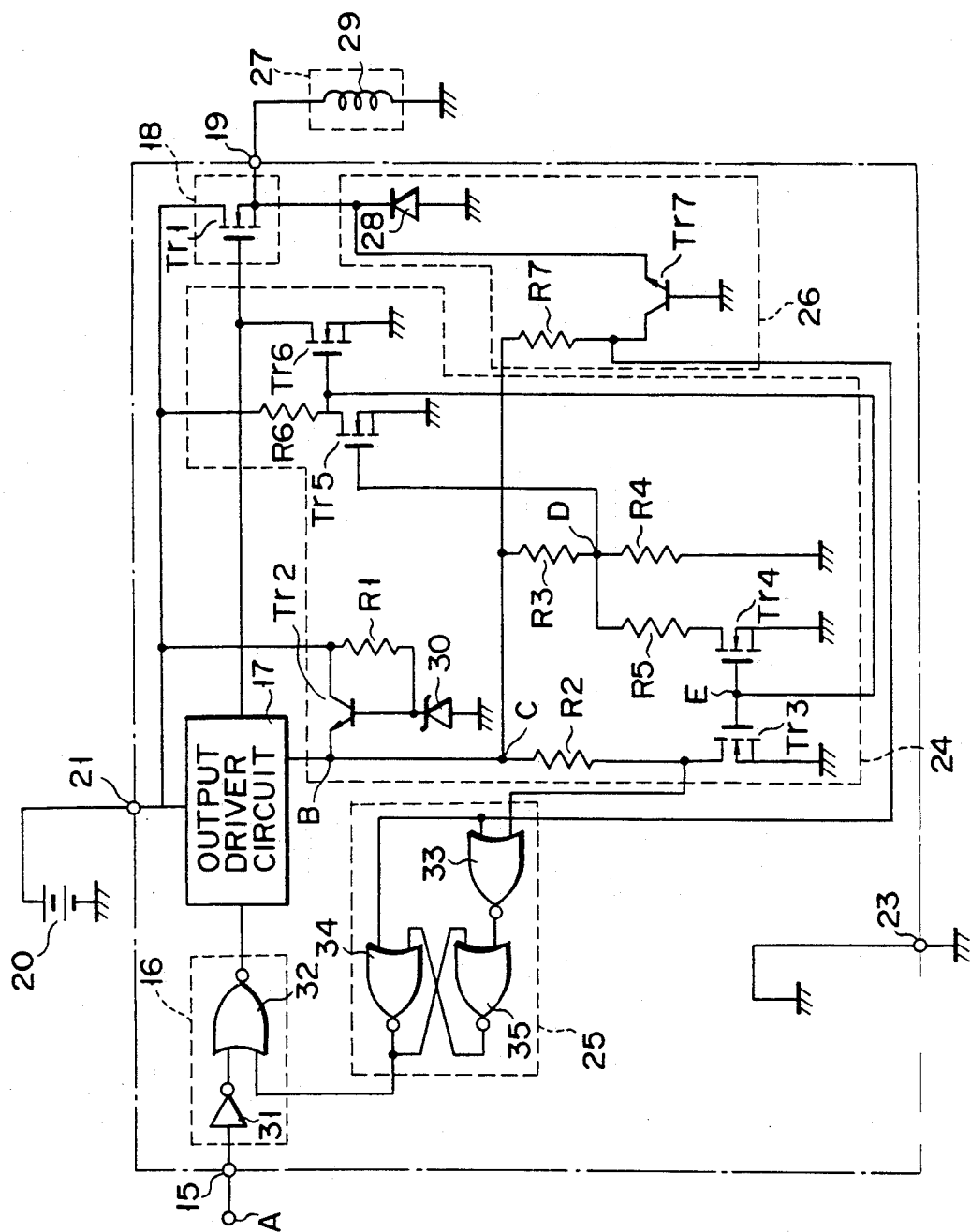
F I G. 2

ELECTRONIC CIRCUIT DEVICE FOR PROTECTING ELECTRONIC CIRCUITS FROM UNWANTED REMOVAL OF GROUND TERMINAL

BACKGROUND OF THE INVENTION

1. Field of the Invention

The present invention relates to an electronic circuit device used for vehicle AC regulators or the like, and more particularly, to a circuit for protecting electronic circuits in the device from a change in a ground potential when a ground terminal of the electronic circuit device has been removed.

2. Description of the Related Art

As an electronic circuit generally used for vehicle AC regulators or the like, a low-side switching system circuit arrangement has been widely employed. In this circuit, one terminal of an output switching element is connected to an external power supply through an external load and the other terminal of the output switching element is grounded.

FIG. 4 shows a low-side switching system electronic circuit whose output terminal is connected to an external power supply through an external load. More specifically, an input terminal 1 for receiving a signal supplied from an external circuit A is connected to an output driver circuit 2, and the output driver circuit 2 is connected to an output switching element 3. The output switching element 3 is connected to an output terminal 4 of the electronic circuit. The output driver circuit 2 is connected to an external power supply 6a through a power supply terminal 5. The output driver circuit 2 and the output switching element 3 are connected to a ground terminal 7 and grounded.

One terminal of an external load 8a is connected to the output terminal 4, and the other terminal of the load 8a is connected to the external power supply 6a.

In such an electronic circuit, the output switching element 3 is driven by a driving signal from the output driver circuit 2, and its output signal is fed from the output terminal 4.

FIG. 5 shows a high-side switching system electronic circuit, wherein an output switching element is connected to an external power supply, and an external load is grounded.

More specifically, as in FIG. 4, an input terminal 9 for receiving a signal from an external circuit A is connected to an output driver circuit 10, and the output driver circuit 10 is connected to an output switching element 11. The output switching element 11 is connected to an output terminal 12 of the electronic circuit.

The output driver circuit 10 and the output switching element 11 are connected to an external power supply 6b through a power supply terminal 13. One terminal of the output driver circuit 10 is connected to a ground terminal and grounded. One terminal of an external load 8b is connected to the output terminal 12, and the other terminal of the external load 8b is grounded.

In such a high-side switching system electronic circuit, since the external load is grounded as compared with the conventional low-side switching system electronic circuit, it can be easily replaced so that the electronic circuit is easily handled. According to this advantage, a low-side switching system electronic circuit used for vehicle AC regulators is being replaced with a high-side switching system electronic circuit.

However, in the high-side switching system electronic circuit shown in FIG. 5, when a ground terminal 14 has been removed from the ground, the safety associated with controlling the electronic circuit or the like is not considered.

More specifically, when the ground terminal 14 has been removed from the ground, a current from the external power supply 6b is supplied to the ground terminal 14 through the circuits constituting the electronic circuit, and an electric potential of the ground terminal is increased. The applied voltage from the external power supply 6b, which is measured from the ground terminal 14 whose electric potential is a reference electric potential, appears to be decreased by an increase in the electric potential of the ground terminal 14.

As a result, while the voltage of the external power supply 6b is applied to the output switching element 11, the input signal is supplied to it under such a condition that the reference voltage is changing, thereby feeding the output signal to the external load 8b through the output terminal 12. Therefore, the output of the electronic circuit will not be cut off while keeping the output control under the unstable condition. Accordingly, the output control will become impossible.

SUMMARY OF THE INVENTION

It is, therefore, an object of the present invention to provide an improved high-side switching system electronic circuit device.

It is another object of the present invention to provide a protection means for cutting off the output when a ground terminal of the electronic circuit device has been removed from an external ground.

According to one aspect of the present invention, there is provided an electronic circuit device with an external ground terminal used for vehicle AC regulators, etc., which comprises a detection circuit for detecting that the external ground terminal has been removed from a ground, and a protection circuit for protecting electronic circuits of the device according to the detected signal fed from the detection circuit. The protection circuit includes a low voltage protection circuit for stopping an operation of an output transistor of the electronic circuit, a memory circuit (latch circuit) operated by output signals from both the detection circuit and the low voltage protection circuit, and an input cut-off circuit for cutting off input signals applied to the electronic circuit device.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 2 is a circuit diagram showing the electronic circuit device shown in FIG. 1;

DETAILED DESCRIPTION OF THE PREFERRED EMBODIMENT

An electronic circuit device having a protection means according to an embodiment of the present invention will be described in detail with reference to the accompanying drawings.

Figure 1:
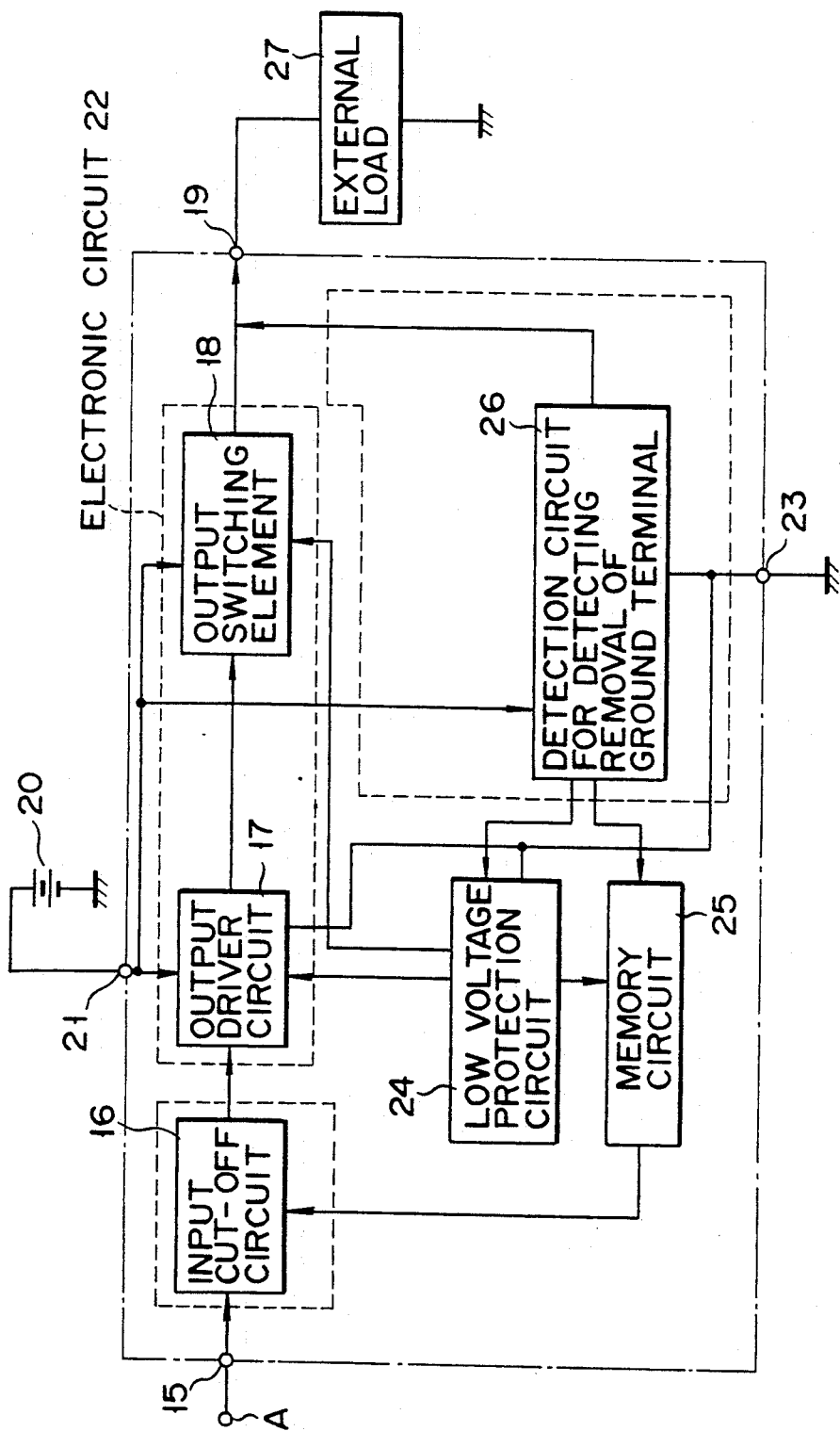
FIG. 1 is a block diagram showing a high-side switching system electronic circuit device having a protection means according to an embodiment of the present invention.

FIG. 1 shows a block diagram of a high-side switching system (load ground system) electronic circuit device according to an embodiment of the present invention, which includes a protection means provided with a protection circuit, a detection circuit, and the like. In this case, an electronic circuit device having an input terminal 15, an output terminal 19, a power supply terminal 21, and a ground terminal 23 externally grounded, is shown by an one-dot, one-dash line, and further includes a high-side switching system electronic circuit 22 which has an output driver circuit 17 and an output switching element 18 and which is protected by a protection means.

More specifically, an output terminal A of an external circuit is connected to an input cut-off circuit 16 through the input terminal 15. The input cut-off circuit 16 is connected to the output driver circuit 17, and the output driver circuit 17 is connected to the output switching element 18.

The output driver circuit 17 and the output switching element 18 are connected to a power supply terminal 21 connected to an external power supply 20.

The output terminal of the output switching element 18 is connected to an output terminal 19 of the electronic circuit device, to which an external load 27 is connected, and the output terminal of the output switching element 18 is connected to a detection circuit 26 for detecting that a ground terminal 23 of the electronic circuit device has been removed from the ground.

A low voltage protection circuit 24 for receiving an output signal of the detection circuit 26 is connected to the output driver circuit 17 and the output switching element 18, and a memory circuit 25 for receiving both output signals of the low voltage protection circuit 24 and the detection circuit 26, which serves as a latch circuit, is connected to the input cut-off circuit 16.

In the electronic circuit device having such an arrangement, an input signal is entered into the output driver circuit 17 through the input cut-off circuit 16 from the output terminal A of the external circuit. The output switching element 18 is driven by the driving signal of the output driver circuit 17, and the output signal of the output switching element is fed to the external load 27.

When the ground terminal 23 has been removed from the ground, however, a current from the external power supply 20 is supplied to the ground terminal 23 through the circuits constituting the electronic circuit device, thereby raising the electric potential of the ground terminal 23. Depending upon such an increase in the electric potential, a voltage applied from the external power supply, which is measured from the ground terminal 23 whose electric potential is a reference electric potential, appears to be decreased.

When this voltage drop occurs, the low voltage protection circuit 24 is operated to decrease the drive signal, fed from the output driver circuit 17, to the same electric potential as in the ground terminal 23, so that the output switching element 18 is not driven.

In addition, as described above, when the ground terminal 23 is removed from ground, the detection circuit 26 is operated by a potential difference which is generated by a current flowing from the ground terminal 23 to the output terminal 19 through a circuit element such as a diode or a resistor included in the detection circuit 26, thereby applying a signal representing the removed condition of the ground terminal to the memory circuit 25.

The memory circuit 25 sends an input cut-off signal to the input cut-off circuit 16 according to both the signal representing the removed condition of the ground terminal and a protective operation signal fed from the low voltage protection circuit 24.

The input cut-off circuit 16 breaks the input signal from the external circuit according to the signal indicating the input signal cut-off condition not to drive the output driver circuit 17.

As described above, even if the ground terminal has been removed from the ground, the output driver circuit 17 and the output switching element 18 will not be driven to protect the electronic circuit 22.

In this embodiment, it is proposed to adopt a charge pump circuit as the output driver circuit 17. However, other circuits may be used if they can drive the switching element 18.

An electronic circuit device according to the preferred embodiments of the present invention, provided by practical circuit elements instead of the above described block diagram, will be described with reference to FIG. 2.

The output switching element 18 is provided by an output transistor Tr1 of MOSFET, wherein the drain is connected to the power supply terminal 21, the source is connected to both the output terminal 19 and a diode 28 of the detection circuit 26, and the gate is connected to the output driver circuit 17, respectively.

A coil 29 is connected to the output terminal 19 as the external load 27.

The low voltage protection circuit 24 has a transistor Tr2, whose collector, emitter and base are connected to the power supply terminal 21, to the output driver circuit through a connection point B, and to the cathode of a Zener diode 30 whose anode is grounded, respectively. A resistor R1 is connected between the collector and the base of the transistor Tr2 to provide an internal power supply.

A connection point C is connected through a resistor R2 to a drain of a transistor Tr3 whose source is grounded.

One terminal of a resistor R3 is connected to the connection point C, while the other terminal of the resistor R3, one terminal of a resistor R4 and one terminal of a resistor R5 are connected to a connection point D and the other terminal of the resistor R5 is connected to a drain of a transistor Tr4. The source of the transistor Tr4 is grounded, and its gate and the gate of the transistor Tr3 are connected to a connection point E in common. These transistors Tr3 and Tr4 provide a mirror circuit.

A resistor R6 is connected between the power supply terminal 21 and a drain of a transistor Tr5, whose source is grounded. The gate of the transistor Tr5 is connected to the connection point D. The drain of the transistor Tr5 is connected to both the connection point E and a gate of a transistor Tr6.

The drain of the transistor Tr6 is connected to the output terminal of the output driver circuit 17, and the source of the transistor Tr6 is grounded.

The detection circuit 26 includes an np transistor Tr7 whose base is grounded. The collector of the transistor Tr7 is connected to the connection point C through a resistor R7, and its emitter is connected to the cathode of the diode 28 connected between the source of the transistor Tr1 and the ground.

For providing the input cut-off circuit 16 to cut off the input signal from the input terminal 15, an inverter circuit element 31 and a NOR circuit 32 are connected in series between the input terminal 15 and the input terminal of the output driver circuit 17. The other input terminal of the NOR circuit 32 is connected to the output terminal of the memory circuit 25.

The memory circuit 25 serves as a latch circuit provided by three NOR circuits 33, 34 and 35. The input terminal of the latch circuit is connected to both the drain of the transistor Tr3 and the collector of the transistor Tr7, and the output terminal of the latch circuit is connected to one input terminal of the NOR circuit 32.

The electronic circuit device described above operates as follows. When the ground terminal 23 is removed from the ground, the electric potential of the ground terminal is increased. The electric potential of the ground terminal becomes a sum of the voltage of the output terminal 19 and the voltage generated by the diode 28 in the forward direction, and is increased to of the order of the applied voltage level of the external power supply.

When the electric potential is increased, the transistor Tr7 is turned on according to a potential difference caused by the diode 28, thereby decreasing the electric potential of the collector of the transistor Tr7.

The applied voltage from the external power supply 20 appears to be decreased in accordance with the increase in the electric potential, so that the low voltage protection circuit 24 is operated.

Depending upon the apparent decrease in the applied voltage, the output voltage of the internal power supply is decreased. Then, the transistor Tr5 operated by the output voltage from the internal power supply is turned off, and the transistor Tr6 is turned on. Since the transistor Tr6 is turned on, the gate voltage of the output switching element 18 is decreased to turn off the transistor Tr1.

At this time, the signal entered from the collector of the transistor Tr7 to the NOR circuit 33 of the memory circuit 25 is inverted from a high (H) signal to a low (L) signal, and the signal entered from the drain of the transistor Tr3 of the low voltage protection circuit 24 is also inverted from an H signal to an L signal.

Subsequently, the output signal applied from the memory circuit 25 to the NOR circuit 32 is inverted from an L signal to an H signal.

Therefore, since the one input terminal of the NOR circuit 32 becomes the H signal, the NOR circuit 32 does not feed the output signal even if the input signal from the external input terminal is entered into the other input terminal of the NOR circuit 32. As a result, the output driver circuit 17 is not driven.

Though the signal recognizing the removal of the ground terminal is fed back from the memory circuit 25 to the NOR circuit 32, in the embodiment the output switching element 18 may be directly turned off.

Moreover, the MOSFET is used as the switching element 18, but elements capable of ON/OFF operating in the high-side switching system may be used. Similarly, though the detection circuit 26 is provided by the diode 28, the transistor Tr7 and the resistor R7, it may be provided by a resistor or a diode for detecting a current therethrough when the ground terminal 23 has been removed from the ground, a voltage divider circuit, and a comparator.

It will be apparent that all of the ground terminals of the circuit elements are connected to the ground terminal 23 within the electronic circuit device, and that the electric potential of the ground terminal 23 becomes the ground potential when it is grounded.

FIGS. 3A to 3D show output waveforms fed from the output terminal 19 when the ground terminal of the electronic circuit device shown in FIG. 2 has been removed from the ground.

Figure 3A:
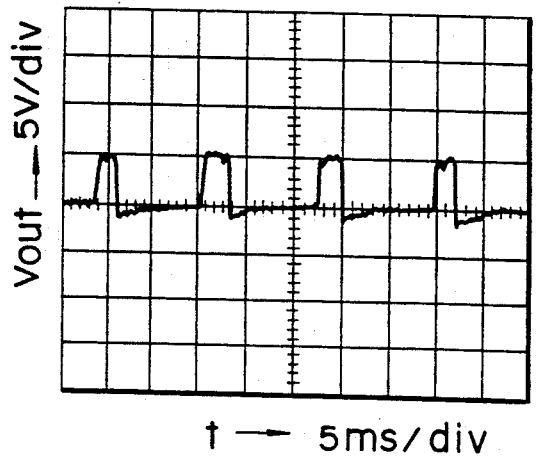
FIGS. 3A to 3D are waveform charts showing output waveforms at an output terminal of the electronic circuit device shown in FIG. 2.
Figure 3B:
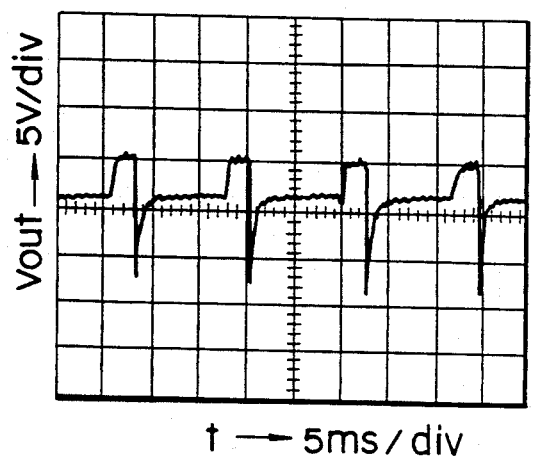
Figure 3C:
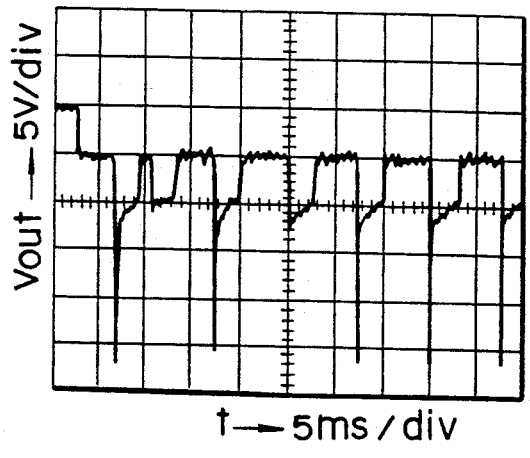

More specifically, FIGS. 3A to 3C show output waveforms of the electronic circuit device only having the low voltage protection circuit 24 shown in FIG. 2, (the memory circuit 25 and the detection circuit 26 are removed). In this case a load (reactance) of the external load 27 connected to the output terminal 19 is increased in order of (A)<(B)<(C) to measure the waveforms.

According to these waveform charts, the drive voltage applied to the gate of the transistor Tr1 of the output switching element 18 is decreased to the reference voltage (the terminal voltage of the ground terminal 23) when the transistor Tr6 of the low voltage protection circuit 24 is turned on. Since input signals from the external terminal 15 ar intermittently supplied to the output driver circuit 17, however, a pulsed drive voltage is applied to the gate of the transistor Tr1 to intermittently operate it. Therefore, an unstable output appears at the output terminal 19 as shown in the output waveforms described above. It can be understood that the unstable output is applied to the external load 27.

Figure 3D:
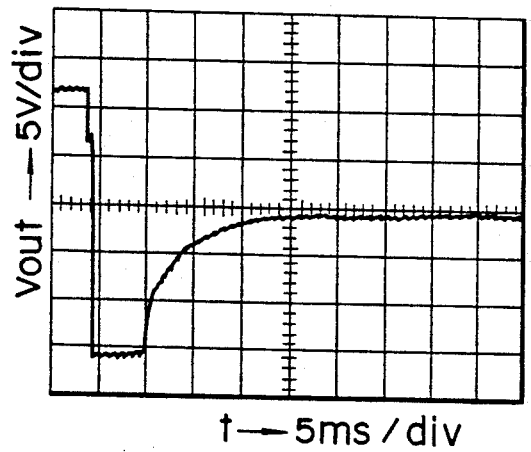
Figure 4:
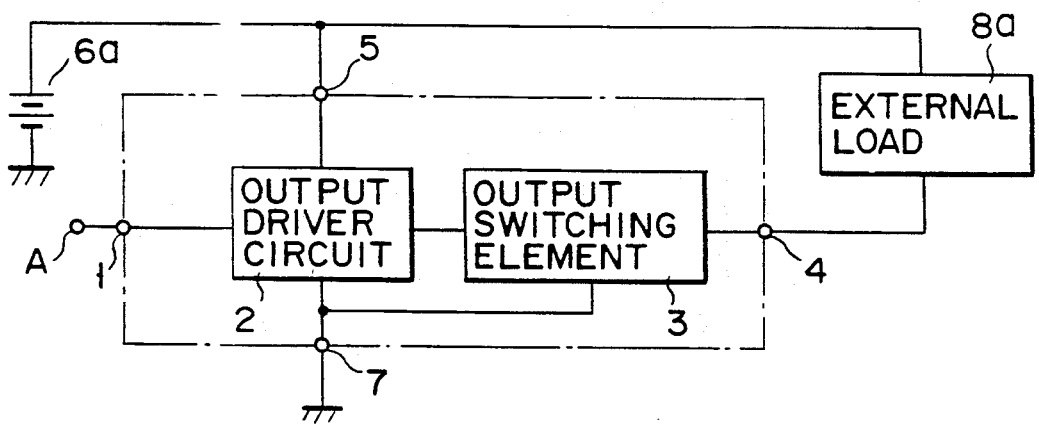
FIG. 4 is a block diagram showing a conventional low-side switching system electronic circuit device.
Figure 5:
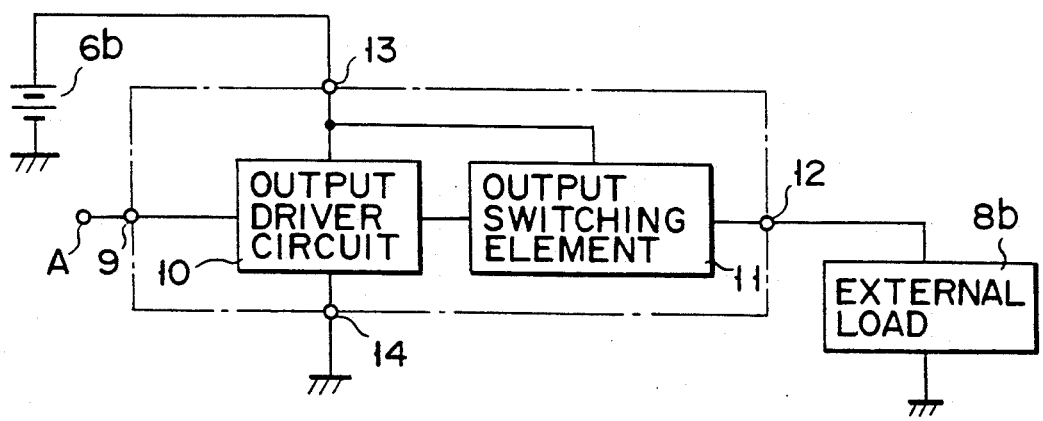
FIG. 5 is a block diagram showing a conventional high-side switching system electronic circuit device.

FIG. 3D shows an output waveform fed from the output terminal 19 of the electronic circuit, device according to the preferred embodiment of the present invention.

According to the output waveform shown in FIG. 3D, since the detection circuit 26 and the memory circuit 25 are operated in addition to the low voltage protection circuit 24, the input signal from the external terminal 15 is not entered into the output driver circuit 17, and the output switching element 18 does not operate. Therefore, it will be apparent that no output is fed from the output terminal 19.

As has been described, according to the high-side switching system electronic circuit device having the protection means, when the ground terminal of the electronic circuit device is removed from the external ground, the output will be cut off, thereby attaining the protection and safety of the electronic circuit.

It is further understood by those skilled in the art that the foregoing description is a preferred embodiment of the disclosed device and that various changes and modifications may be made in the invention without departing from the spirit and scope thereof.

What is claimed is:

1. An electronic circuit device having a ground terminal and adapted for receiving input signals, comprising:

an electronic circuit responsive to said input signals;
a detection circuit for detecting and generating a detection signal when said ground terminal has been removed from a ground;

a low voltage protection circuit, responsive to the detection signal, for generating an output signal to protect said electronic circuit by stopping an operation of a switching circuit, and an input cut-off circuit for cutting off said input signals, said input cut-off circuit being driven by a memory circuit according to said detection circuit and said low voltage protection circuit.

2. The device according to claim 1, wherein said memory circuit comprises a latch circuit including logic circuits.

3. A circuit comprising:

a ground terminal adapted for connection to a first potential;

an input terminal for receiving an input signal from an external circuit;

a first circuit, having a node electrically coupled to the ground terminal, for generating an output in response to the input signal;

a second circuit, having a node electrically coupled to the ground terminal, including means for detecting when the ground terminal has been removed from the first potential, by detecting a change in an electronic potential of the ground terminal, an input cut-off circuit coupled between the input terminal and the first circuit to control an operation of the first circuit, a low voltage protection circuit, responsive to the detecting means, for controlling an operation of the first circuit, and memory means, responsive to the detecting means and to the low voltage protection circuit, for controlling an operation of the input cut-off circuit.

4. The circuit according to claim 3, wherein the first circuit includes a driver circuit; and a switching circuit coupled to the driver circuit.

5. The circuit according to claim 4, wherein the driver circuit includes means responsive to an output signal from the input cut-off circuit.

6. The circuit according to claim 3, wherein the detecting means includes a circuit element for conducting a current, when the ground terminal is removed from the first potential, to raise an electronic potential on the ground terminal.

7. The circuit according to claim 6, wherein the circuit element includes a diode.

8. The circuit according to claim 6, wherein the circuit element includes a resistor.

9. The circuit according to claim 3, wherein the input cut-off circuit includes a logic circuit.

10. The circuit according to claim 9, wherein the logic circuit includes an inverter; and a NOR circuit coupled to the inverter.

11. The circuit according to claim 3, wherein the memory means includes a latch circuit including a logic circuit.

12. The circuit according to claim 11, wherein the logic circuit includes a combination of NOR circuits.

13. The circuit according to claim 3, wherein the low voltage protection circuit includes an internal power supply;

a mirror circuit; and a circuit for controlling an operation of the switching circuit.

14. A circuit comprising:

a ground terminal adapted for connection to a first potential;

first means, having a control input, for receiving an input signal and selectively generating a first signal corresponding to the input signal;

second means for generating an output in response to the first signal;

third means for detecting when the ground terminal has been removed from the first potential to generate a second signal;

fourth means, responsive to the second signal, for controlling an operation of the second means and for generating a third signal, and memory means, responsive to the second signal and to the third signal, having an output coupled to the control input of the first means.

15. The circuit according to claim 14, wherein the memory means includes a latch circuit.

16. The circuit according to claim 14, wherein the memory means includes a logic gate; and a latch circuit coupled to the logic gate.

17. The circuit according to claim 14, wherein the fourth means includes a mirror circuit.

* * * * *